(12) United States Patent
Ko et al.

(10) Patent No.: US 9,293,424 B2
(45) Date of Patent: Mar. 22, 2016

(54) SEMICONDUCTOR STRUCTURE FOR ELECTROSTATIC DISCHARGE PROTECTION

(71) Applicant: Advanced Analog Technology, Inc., Hsinchu (TW)

(72) Inventors: Chun-Chung Ko, Hsinchu County (TW); Chih-Lun Wu, Changhua County (TW); Shuo-Yen Lin, Hsinchu County (TW)

(73) Assignee: Advanced Analog Technology, Inc., Taiyuan Hi-Tech Industrial Park, Zhubei, Hsinchu County (TW)

( * ) Notice: Subject to any disclaimer, the term of this patent is extended or adjusted under 35 U.S.C. 154(b) by 33 days.

(21) Appl. No.: 14/512,453

(22) Filed: Oct. 12, 2014

(65) Prior Publication Data

US 2015/0179628 A1    Jun. 25, 2015

(30) Foreign Application Priority Data

Dec. 20, 2013  (TW) .............................. 102147561 A
Aug. 8, 2014   (TW) .............................. 103127374 A (51) Int. Cl.
  *H01L 23/58*   (2006.01)
  *H01L 29/66*   (2006.01)
  *H01L 23/60*   (2006.01)
  *H01L 27/02*   (2006.01)

(52) U.S. Cl.
  CPC .............. *H01L 23/60* (2013.01); *H01L 23/585* (2013.01); *H01L 27/0292* (2013.01); *H01L 2924/0002* (2013.01)

(58) Field of Classification Search
  CPC ............ H01L 21/8238; H01L 27/0922; H01L 27/11807; H01L 2027/11807; H01L 21/76897; H01L 21/8224; H01L 21/8228; H01L 21/8234; H01L 21/823885; H01L 29/0847; H01L 29/42316; H01L 29/42384; H01L 29/66
  USPC ......... 257/173, 327–328, 355–357, 360, 452, 257/E21.576, E21.585; 438/136, 137, 156, 438/173, 192, 206, 212, 424, 427, 428, 591
  See application file for complete search history.

(56) References Cited

U.S. PATENT DOCUMENTS

2007/0007545 A1 *   1/2007   Salcedo et al. ................ 257/127

* cited by examiner

*Primary Examiner* — Selim Ahmed
*Assistant Examiner* — Moin Rahman
(74) *Attorney, Agent, or Firm* — Winston Hsu; Scott Margo (57) ABSTRACT

A semiconductor structure is arranged on an integrated circuit, the integrated circuit includes a seal ring arranged at outer periphery of the integrated circuit, a metal ring arranged at an inner side of the seal ring and a power bus arranged at a side of the metal ring. The semiconductor structure includes a first P type electrode area, a second P type electrode area and a first N type electrode area. The first P type electrode area is formed at a position on a P well corresponding to the seal ring, and coupled to the seal ring. The second P type electrode area is formed at a position on the P well corresponding to the metal ring, and coupled to the metal ring. The first N type electrode area is formed at a position corresponding to the power bus, and coupled to the power bus.

26 Claims, 12 Drawing Sheets

SEMICONDUCTOR STRUCTURE FOR ELECTROSTATIC DISCHARGE PROTECTION

BACKGROUND OF THE INVENTION

1. Field of the Invention

The present invention relates to a semiconductor structure for electrostatic discharge protection, and more particularly, to a semiconductor structure capable of saving space of an integrated circuit and improving electrostatic protection capability.

2. Description of the Prior Art

Electrostatic protection is an important topic in the electronics industry and the semiconductor industry. Electrostatic discharge may cause damage to electronic products. As semiconductor manufacturing processes keep improving, scale of an integrated circuit is getting smaller, so that it also becomes easier to damage the integrated circuits when suffering the electrostatic discharge. In order to prevent the integrated circuit from being damaged by the electrostatic discharge, the integrated circuit of the prior art may comprise an electrostatic protection circuit for guiding static electricity to ground quickly when receiving the static electricity. However, in the integrated circuit of the prior art, the electrostatic protection circuit may occupy certain space, so at to increase difficulty of designing the integrated circuit. Moreover, in order to save space, the electrostatic protection circuit may be arranged at a specific position in the integrated circuit, such that elements far from the electrostatic protection circuit cannot be effectively protected by the electrostatic protection circuit in the integrated circuit.

SUMMARY OF THE INVENTION

The present invention provides a semiconductor structure for electrostatic discharge protection, which is arranged on an integrated circuit. The integrated circuit comprises a seal ring arranged at outer periphery of the integrated circuit, a metal ring arranged at an inner side of the seal ring, and a power bus arranged at a side of the metal ring. The semiconductor structure comprises a first P type electrode area, a second P type electrode area, and a first N type electrode area. The first P type electrode area is formed at a position on a P well corresponding to the seal ring, and coupled to the seal ring. The second P type electrode area is formed at a position on the P well corresponding to the metal ring, and coupled to the metal ring. The first N type electrode area is formed at a position corresponding to the power bus, and coupled to the power bus. Wherein, the seal ring and the metal ring are coupled to ground, and the power bus is coupled to a voltage source.

The present invention further provides a semiconductor structure for electrostatic discharge protection, which is arranged on an integrated circuit. The integrated circuit comprises a seal ring arranged at outer periphery of the integrated circuit, a metal ring arranged at an inner side of the seal ring, and a power bus arranged at a side of the metal ring. The semiconductor structure comprises a first N type electrode area, a second N type electrode area, and a first P type electrode area. The first N type electrode area is formed at a position on an N well corresponding to the seal ring, and coupled to the seal ring. The second N type electrode area is formed at a position on the N well corresponding to the power bus, and coupled to the power bus. The first P type electrode area is formed at a position on a P well corresponding to the metal ring, and coupled to the metal ring. Wherein, the seal ring and the power bus are coupled to a voltage source, and the metal ring is coupled to ground.

The present invention further provides a semiconductor structure for electrostatic discharge protection, which is arranged on an integrated circuit. The integrated circuit comprises a seal ring arranged at outer periphery of the integrated circuit, a metal ring arranged at an inner side of the seal ring, and a power bus arranged at a side of the metal ring. The semiconductor structure comprises a first N type electrode area, a second N type electrode area, and a first P type electrode area. The first N type electrode area is formed at a position on a P well corresponding to the seal ring, and coupled to the seal ring. The second N type electrode area is formed at a position on the P well corresponding to the power bus, and coupled to the power bus. The first P type electrode area is formed at a position on the P well corresponding to the metal ring, and coupled to the metal ring. Wherein, the seal ring and the power bus are coupled to a voltage source, and the metal ring is coupled to ground.

In contrast to the prior art, the semiconductor structure for electrostatic discharge protection of the present invention is arranged at a position corresponding to the seal ring, the metal ring, and the power bus of the integrated circuit, without occupying additional space of the integrated circuit, so as to save space of the integrated circuit. Moreover, since the semiconductor structure for electrostatic discharge protection of the present invention is arranged at outer periphery of the integrated circuit, each element of the integrated circuit can be protected by the nearby semiconductor structure from electrostatic discharge, so as to further improve electrostatic protection capability of the integrated circuit.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
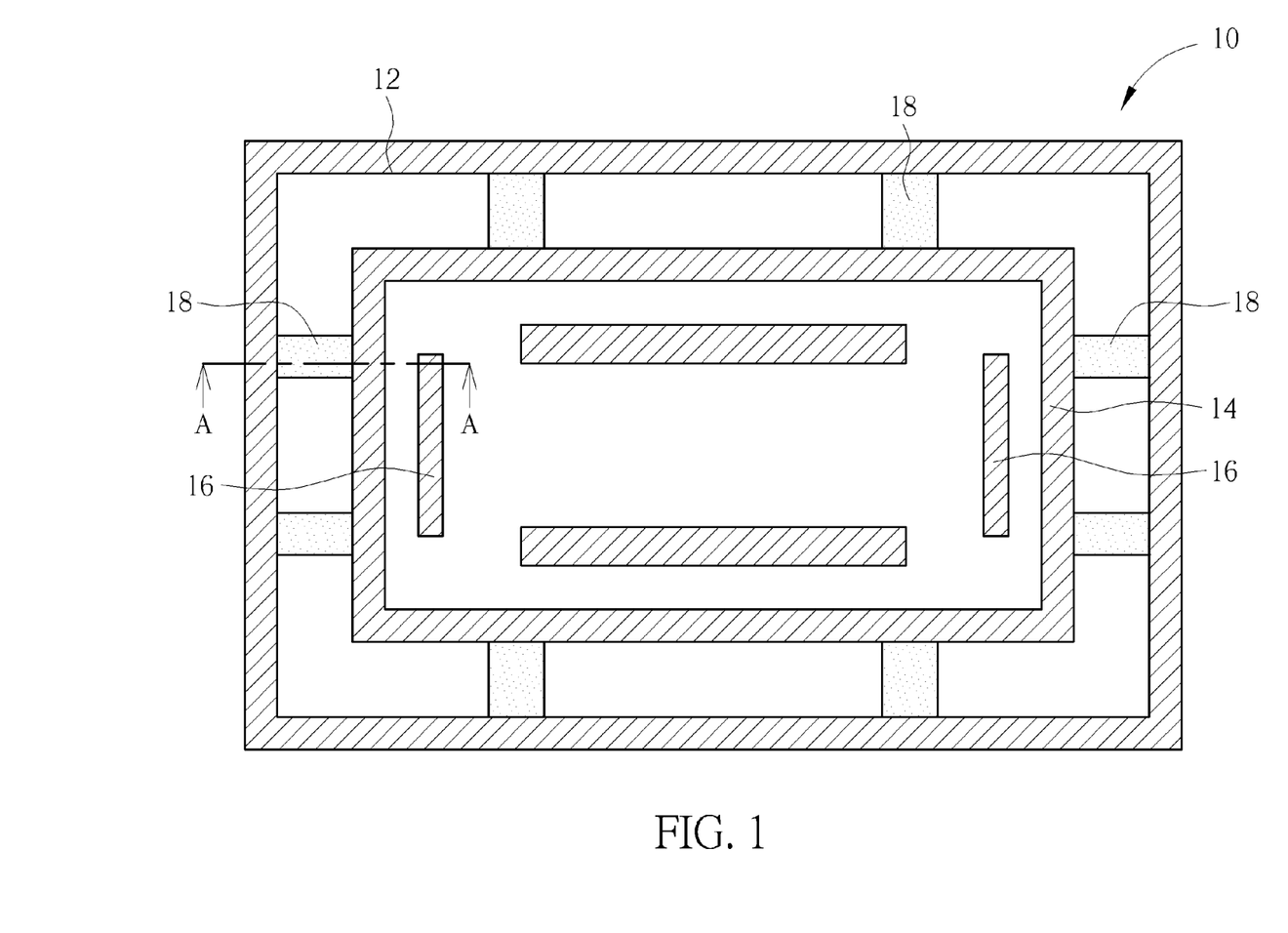
FIG. 1 is a diagram showing a first embodiment of arrangement of an integrated circuit of the present invention.
Figure 2:
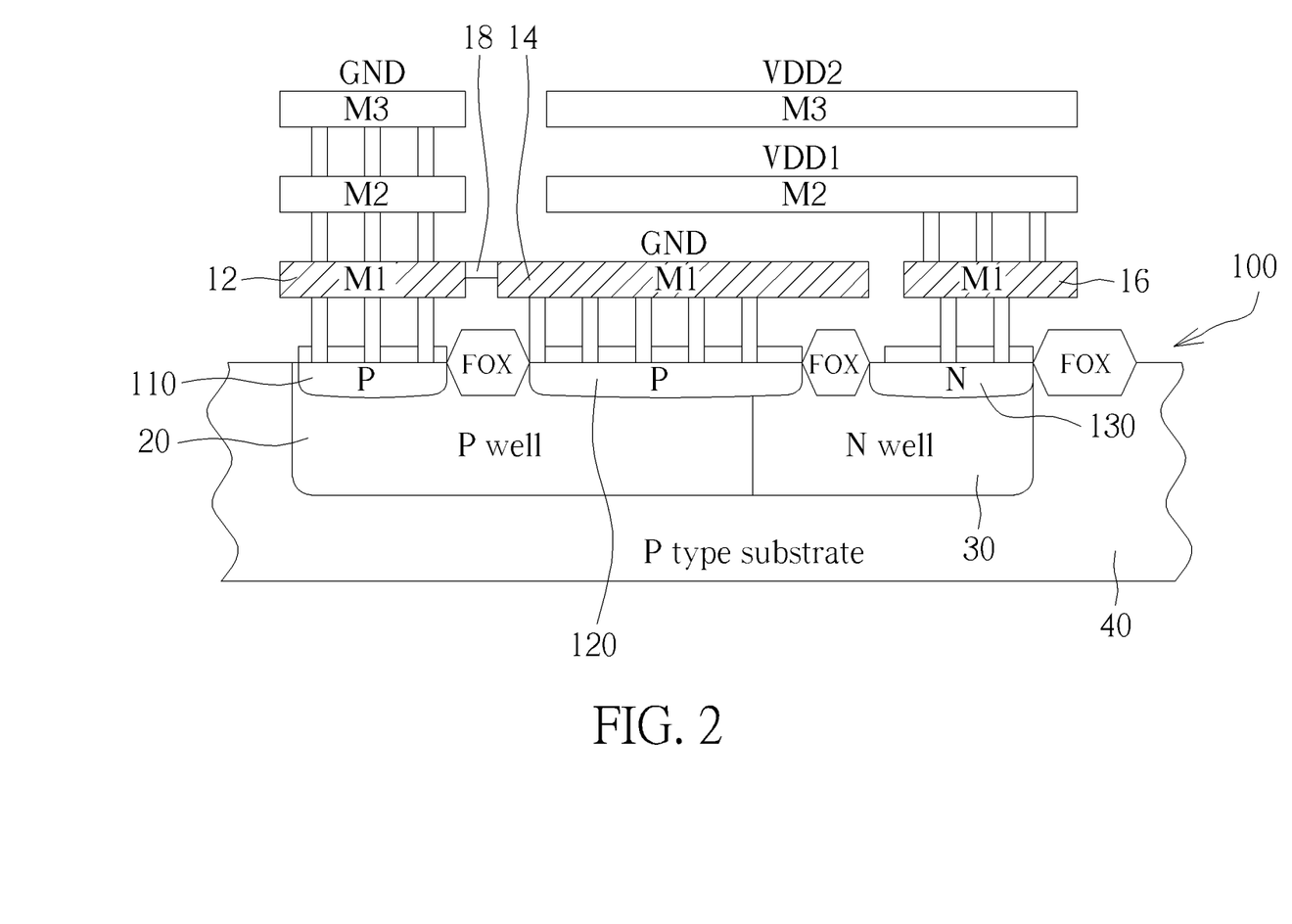
FIG. 2 is a diagram showing a cross-sectional view of a semiconductor structure for electrostatic discharge protection of the present invention corresponding to a cross section line A-A in FIG. 1.

Please refer to FIG. 1 and FIG. 2. FIG. 1 is a diagram showing a first embodiment of arrangement of an integrated circuit of the present invention. FIG. 2 is a diagram showing a cross-sectional view of a semiconductor structure for electrostatic discharge protection of the present invention corresponding to a cross section line A-A in FIG. 1. As shown in figures, an integrated circuit 10 of the present invention comprises a seal ring 12, a metal ring 14, and at least one power bus 16. The seal ring 12 is arranged at outer periphery of the integrated circuit 10. The metal ring 14 is arranged at an inner side of the seal ring 12. The power bus 16 is arranged at an inner side of the metal ring 12. The seal ring 12, the metal ring 14, and the power bus 16 are formed on a metal layer M1 of the integrated circuit 10. The integrated circuit 10 further comprises other metal layers M2, M3 arranged above the metal layer M1 for forming other elements. A semiconductor structure 100 comprises a first P type electrode area 110, a second P type electrode area 120, and a first N type electrode area 130. The first P type electrode area 110 is formed at a position on a P well 20 corresponding to the seal ring 12, and coupled to the seal ring 12. The second P type electrode area 120 is formed at a position on the P well 20 corresponding to the metal ring 14, and coupled to the metal ring 14. The first N type electrode area 130 is formed at a position on an N well 30 corresponding to the power bus 16, and coupled to the power bus 16. Wherein, the seal ring 12 is coupled to a ground level GND, the power bus 16 is coupled to a voltage source VDD1, and the metal ring 14 is coupled to the seal ring 12 via a plurality of coupling units 18, such that the seal ring 12 and the metal ring 14 have the same ground level GND.

In addition, the first P type electrode area 110, the second P type electrode area 120 and the first N type electrode area 130 are separated by a plurality of insulating areas FOX. The insulating areas FOX are field oxide areas. The P well 20 and the N well 30 are formed on a P type substrate 40.

According to the above arrangement, the P well 20, the N well 30, the first P type electrode area 110, the second P type electrode area 120, and the first N type electrode area 130 can be equivalent to a diode. When the power bus 16 receives static electricity, a PN junction of the diode is broken down due to a high level voltage of the static electricity, so as to discharge current of the static electricity to the seal ring 12 and the metal ring 14 via the first P type electrode area 110 and the second P type electrode area 120, in order to provide electrostatic discharge protection. Moreover, partial energy of the static electricity is absorbed when the PN junction crashes.

Figure 3:
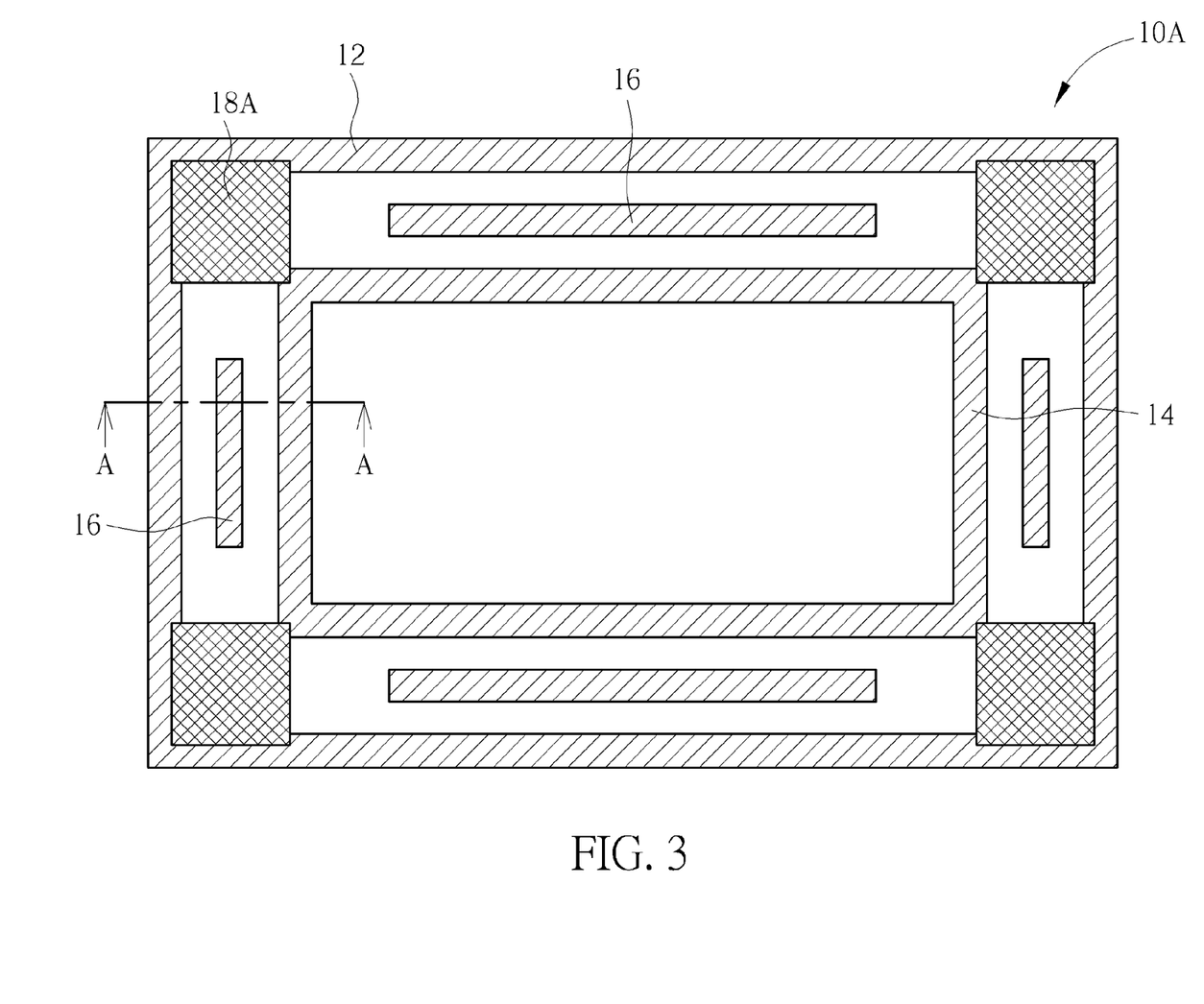
FIG. 3 is a diagram showing a second embodiment of arrangement of the integrated circuit of the present invention.
Figure 4:
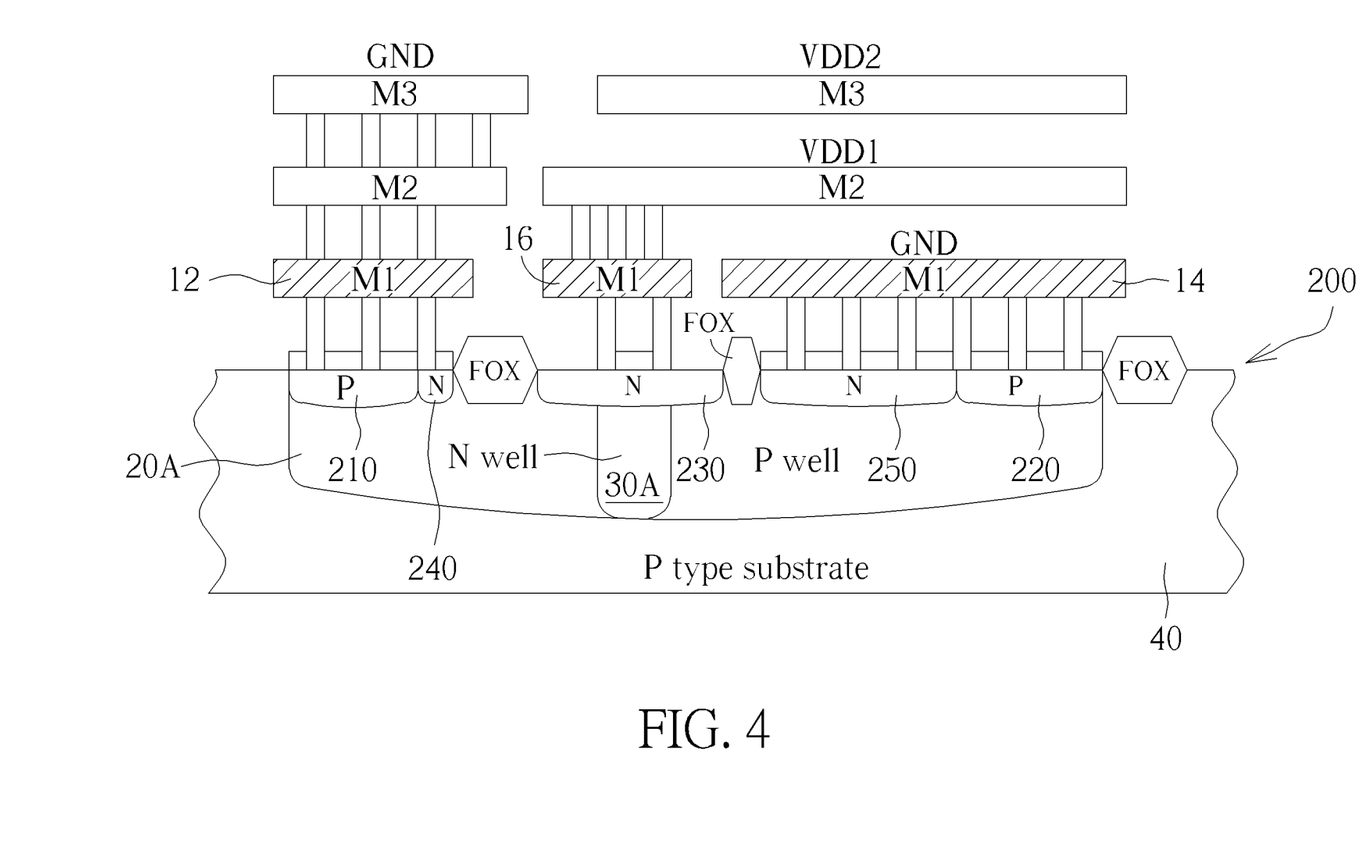
FIG. 4 is a diagram showing a cross-sectional view of the semiconductor structure for electrostatic discharge protection of the present invention corresponding to a cross section line A-A in FIG. 3.

Please refer to FIG. 3 and FIG. 4. FIG. 3 is a diagram showing a second embodiment of arrangement of the integrated circuit of the present invention. FIG. 4 is a diagram showing a cross-sectional view of the semiconductor structure for electrostatic discharge protection of the present invention corresponding to a cross section line A-A in FIG. 3. As shown in figures, an integrated circuit 10A of the present invention comprises a seal ring 12, a metal ring 14, and at least one power bus 16. The seal ring 12 is arranged at outer periphery of the integrated circuit 10A. The metal ring 14 is arranged at an inner side of the seal ring 12. The power bus 16 is arranged between the seal ring 12 and the metal ring 14. A semiconductor structure 200 comprises a first P type electrode area 210, a second P type electrode area 220, a first N type electrode area 230, a second N type electrode area 240, and a third N type electrode area 250. The first P type electrode area 210 is formed at a position on a P well 20A corresponding to the seal ring 12, and coupled to the seal ring 12. The second P type electrode area 220 is formed at a position on the P well 20A corresponding to the metal ring 14, and coupled to the metal ring 14. The first N type electrode area 230 is formed at a position partially on an N well 30A corresponding to the power bus 16, and coupled to the power bus 16. The second N type electrode area 240 is formed at a position on the P well 20A corresponding to the seal ring 12, and coupled to the seal ring 12. The third N type electrode area 250 is formed at a position on the P well 20A corresponding to the metal ring 14, and coupled to the metal ring 14. Wherein, the seal ring 12 is coupled to the ground level GND, the power bus 16 is coupled to a voltage source VDD1, and the metal ring 14 is coupled to the seal ring 12 via a plurality of coupling units 18A, such that the seal ring 12 and the metal ring 14 have the same ground level GND.

In addition, the second N type electrode area 240 is closer to the first N type electrode area 230 than the first P type electrode area 210. The third N type electrode area 250 is closer to the first N type electrode area 230 than the second P type electrode area 220. The first N type electrode area 230, the second N type electrode area 240 and the third N type electrode area 250 are separated by a plurality of insulating areas FOX. The insulating areas FOX are field oxide areas. The P well 20A and the N well 30A are formed on a P type substrate 40.

According to the above arrangement, the P well 20A, the first N type electrode area 230, and the second N type electrode area 240 can be equivalent to a bipolar junction transistor (BJT). The P well 20A, the first N type electrode area 230, and the third N type electrode area 250 can also be equivalent to another bipolar junction transistor. When the power bus 16 receives static electricity, PN junctions of the bipolar junction transistors are broken down due to high level voltage of the static electricity, so as to discharge current of the static electricity to the seal ring 12 and the metal ring 14 via the first P type electrode area 210, the second N type electrode area 240, the second P type electrode area 220, and the third N type electrode area 250, in order to provide electrostatic discharge protection. Moreover, partial energy of the static electricity is absorbed when the PN junctions are broken down.

In addition, in the embodiment of FIG. 4, the N well 30A is not necessarily required. That is, the first N type electrode area 230 can be formed on the P well 20A.

Figure 5:
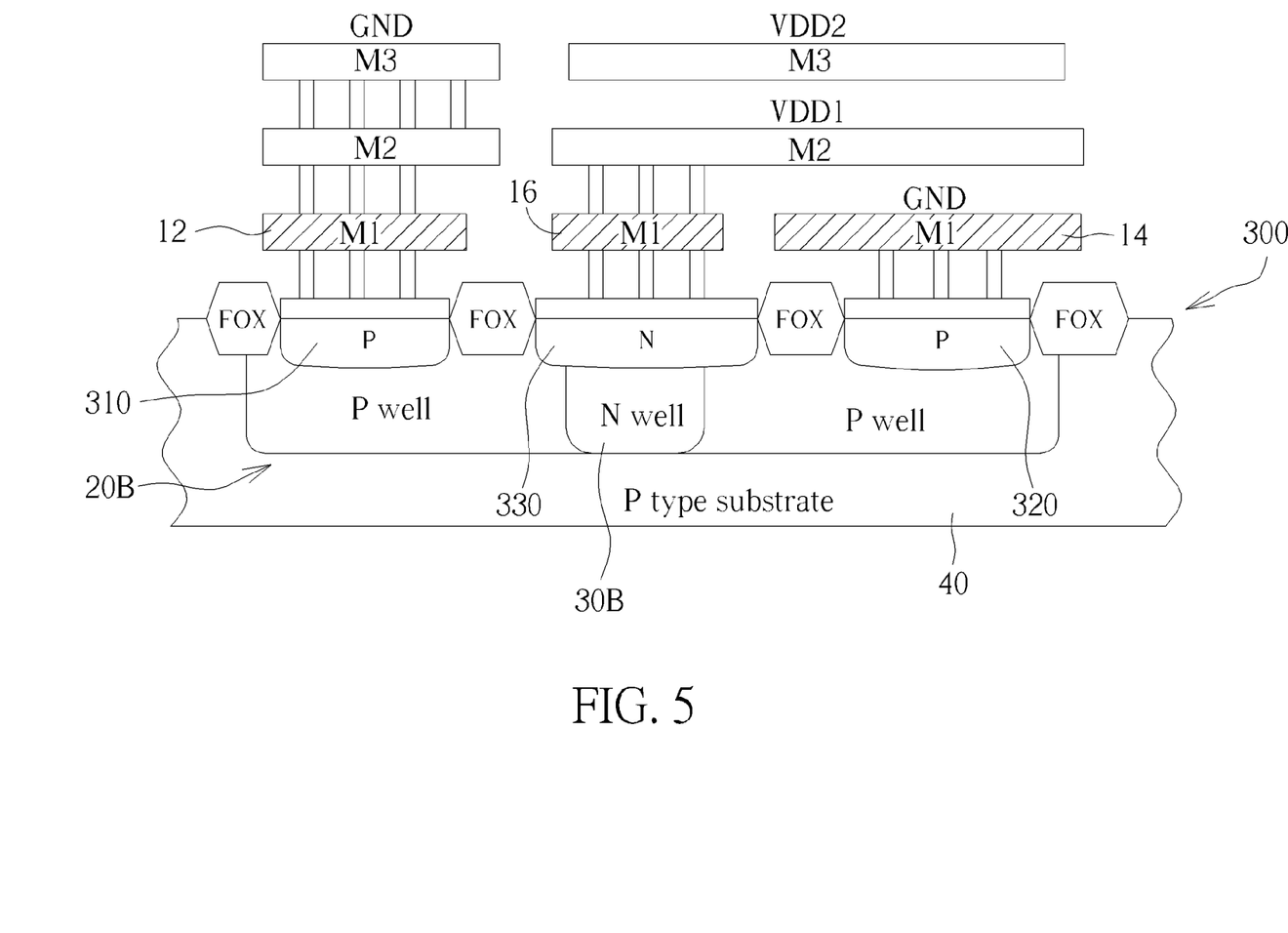
FIG. 5 is a diagram showing another cross-sectional view of the semiconductor structure for electrostatic discharge protection of the present invention corresponding to a cross section line A-A in FIG. 3.

Please refer to FIG. 5, and refer to FIG. 3 as well. FIG. 5 is a diagram showing another cross-sectional view of the semiconductor structure for electrostatic discharge protection of the present invention corresponding to a cross section line A-A in FIG. 3. As shown in figures, a semiconductor structure 300 comprises a first P type electrode area 310, a second P type electrode area 320, and a first N type electrode area 330. The first P type electrode area 310 is formed at a position on a P well 20B corresponding to the seal ring 12, and coupled to the seal ring 12. The second P type electrode area 320 is formed at a position on the P well 20B corresponding to the metal ring 14, and coupled to the metal ring 14. The first N type electrode area 330 is formed at a position on an N well 30B corresponding to the power bus 16, and coupled to the power bus 16.

According to the above arrangement, when the power bus 16 receives static electricity, PN junctions of the semiconductor structure 300 are broken down due to high level voltage of the static electricity, so as to discharge current of the static electricity to the seal ring 12 and the metal ring 14 via the first P type electrode area 310 and the second P type electrode area 320, in order to provide electrostatic discharge protection. Moreover, partial energy of the static electricity is absorbed when the PN junctions are broken down.

In addition, in the embodiment of FIG. 5, the N well 30B is not necessarily required. That is, the first N type electrode area 330 can be formed on the P well 20B.

Figure 6:
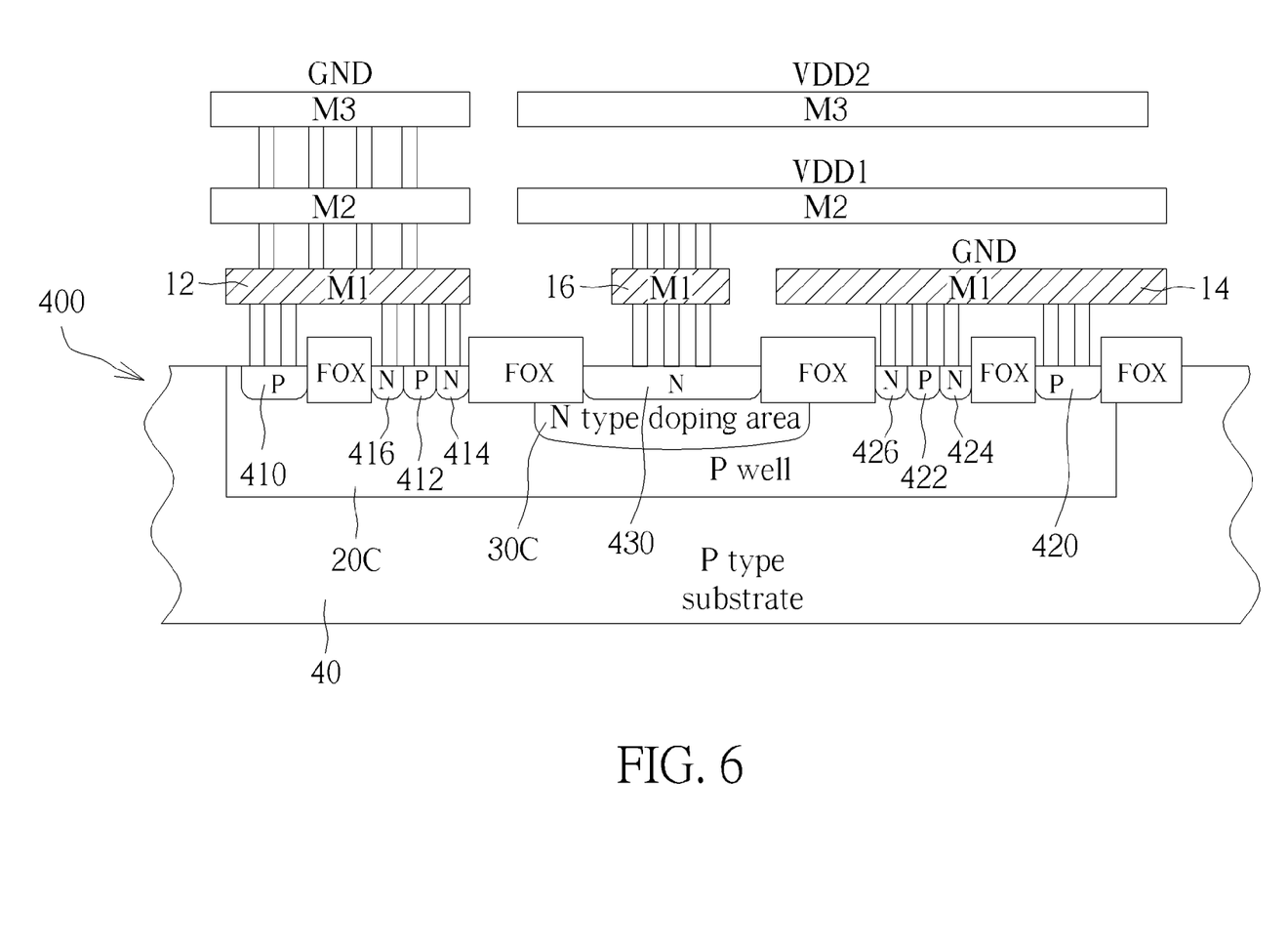
FIG. 6 is a diagram showing another cross-sectional view of the semiconductor structure for electrostatic discharge protection of the present invention corresponding to a cross section line A-A in FIG. 3.

Please refer to FIG. 6, and refer to FIG. 3 as well. FIG. 6 is a diagram showing another cross-sectional view of the semiconductor structure for electrostatic discharge protection of the present invention corresponding to a cross section line A-A in FIG. 3. As shown in FIG. 6, a semiconductor structure 400 comprises a first P type electrode area 410, a second P type electrode area 420, and a first N type electrode area 430. The semiconductor structure 400 further comprises other P type electrode areas 412, 422 and N type electrode areas 414, 416, 424, 426 respectively formed at positions on a P well 20C corresponding to the seal ring 12 and positions on the P well 20C corresponding to the metal ring 14.

According to the above arrangement, when the power bus 16 receives static electricity, PN junctions of the semiconductor structure 400 are broken down due to high level voltage of the static electricity, so as to discharge current of the static electricity to the seal ring 12 and the metal ring 14 via the corresponding P type electrode areas 410, 412, 420, 422 and the corresponding N type electrode areas 414, 416, 424, 426, in order to provide electrostatic discharge protection. Moreover, partial energy of the static electricity is absorbed when the PN junctions are broken down.

In order to further improve the capability resistant to high voltage, the first N type electrode area 430 can be extended outward to form an N type doping area 30C. Doping concentration of the N type doping area 30C is lower than doping concentration of the first N type electrode area 430.

Figure 7:
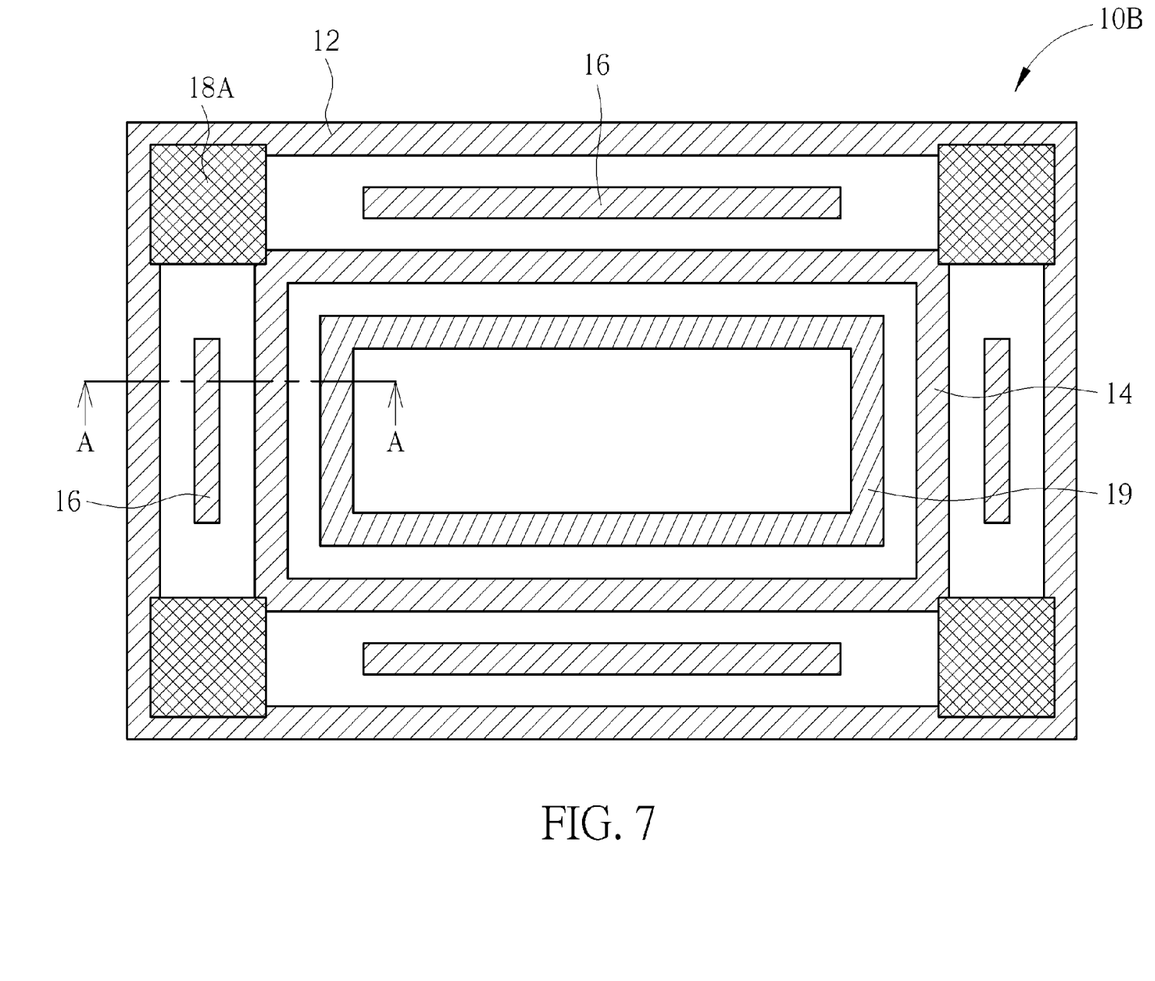
FIG. 7 is a diagram showing a third embodiment of arrangement of the integrated circuit of the present invention.
Figure 8:
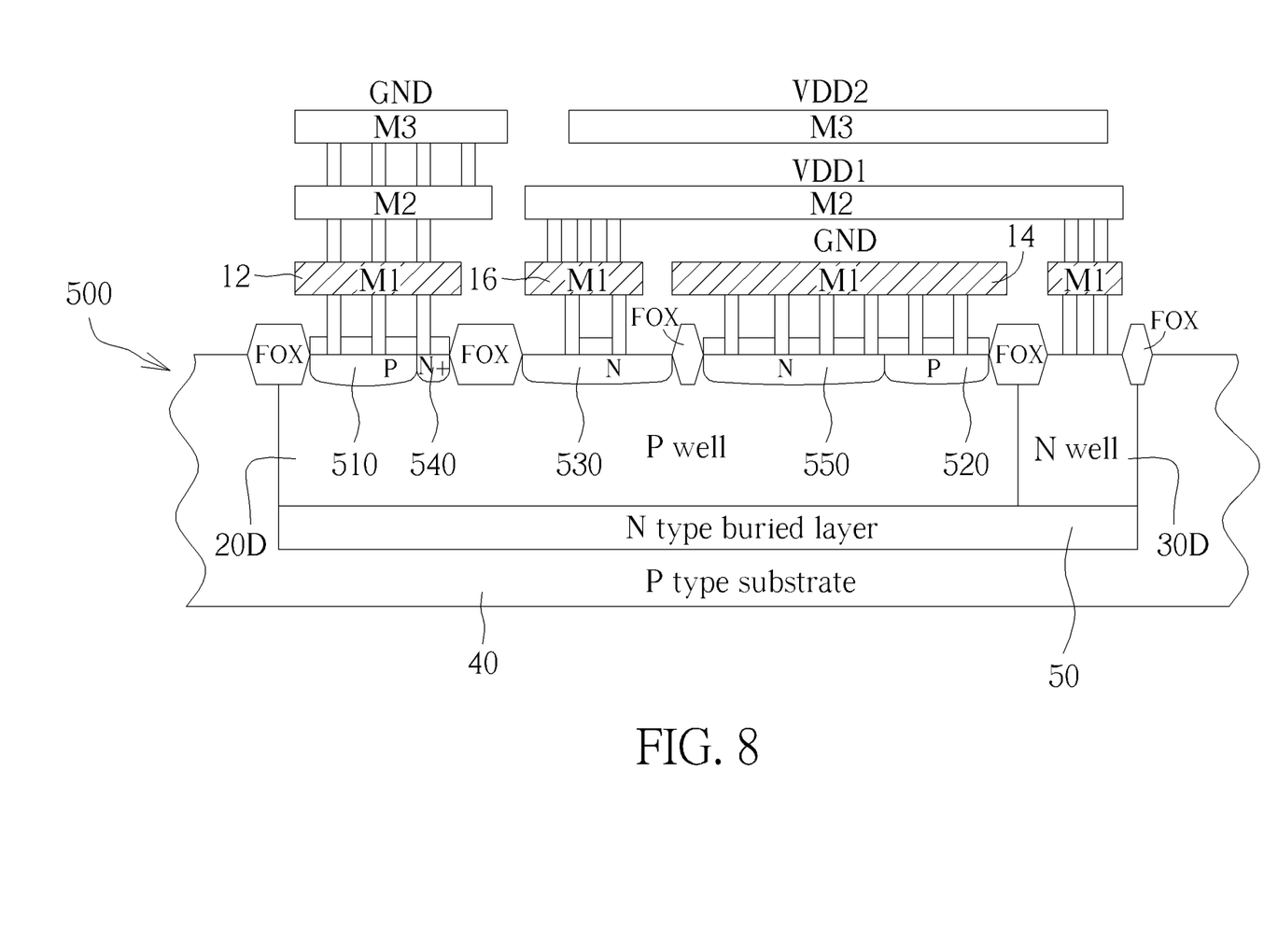
FIG. 8 is a diagram showing a cross-sectional view of the semiconductor structure for electrostatic discharge protection of the present invention corresponding to a cross section line A-A in FIG. 7.

Please refer to FIG. 7 and FIG. 8 together. FIG. 7 is a diagram showing a third embodiment of arrangement of the integrated circuit of the present invention. FIG. 8 is a diagram showing a cross-sectional view of the semiconductor structure for electrostatic discharge protection of the present invention corresponding to a cross section line A-A in FIG. 7. As shown in figures, an integrated circuit 10B of the present invention comprises a seal ring 12, a metal ring 14, at least one power bus 16, and an inner metal ring 19. The seal ring 12 is arranged at outer periphery of the integrated circuit 10B. The metal ring 14 is arranged at an inner side of the seal ring 12. The inner metal ring 19 is arranged at an inner side of the metal ring 14. The power bus 16 is arranged between the metal ring 14 and the seal ring 12. The metal ring 14 is coupled to the seal ring 12 via a plurality coupling units 18A, such that the seal ring 12 and the metal ring 14 have the same ground level GND. A semiconductor structure 500 comprises a first P type electrode area 510, a second P type electrode area 520, a first N type electrode area 530, a second N type electrode area 540, and a third N type electrode area 550. The first P type electrode area 510 is formed at a position on a P well 20D corresponding to the seal ring 12, and coupled to the seal ring 12. The second P type electrode area 520 is formed at a position on the P well 20D corresponding to the metal ring 14, and coupled to the metal ring 14. The first N type electrode area 530 is formed at a position on the P well 20D corresponding to the power bus 16, and coupled to the power bus 16. The second N type electrode area 540 is formed at a position on the P well 20D corresponding to the seal ring 12, and coupled to the seal ring 12. The third N type electrode area 550 is formed at a position on the P well 20D corresponding to the metal ring 14, and coupled to the metal ring 14.

In addition, the integrated circuit 10B further comprises an N type buried layer 50 and an N well 30D. The N type buried layer is arranged between the P well 20D and a P type substrate 40. The N well 30D is arranged at a position corresponding to the inner metal ring 19, and coupled to the inner metal ring 19. The inner metal ring 19 is coupled to the voltage source VDD1 via the metal layer M2.

According to the above arrangement, when the power bus 16 receives static electricity, PN junctions of the semiconductor structure 500 are broken down due to high level voltage of the static electricity, so as to discharge current of the static electricity to the seal ring 12 and the metal ring 14 via the corresponding P type electrode areas 510, 520 and the corresponding N type electrode areas 540, 550, in order to provide electrostatic discharge protection. Moreover, partial energy of the static electricity is absorbed when the PN junctions are broken down. In addition, the N well 30D can be utilized to protect a high voltage element in the integrated circuit 10B.

Figure 9:
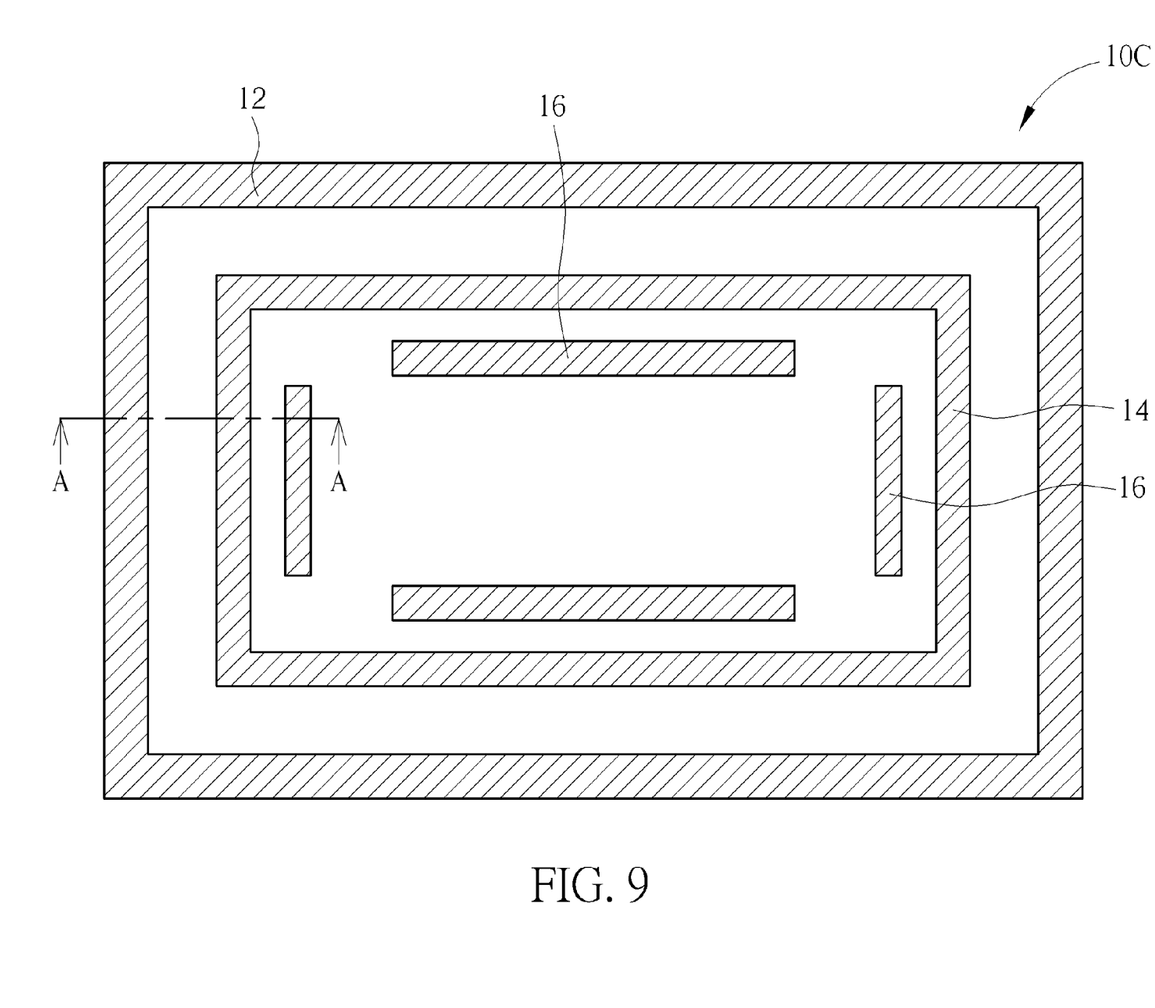
FIG. 9 is a diagram showing a fourth embodiment of arrangement of the integrated circuit of the present invention.
Figure 10:
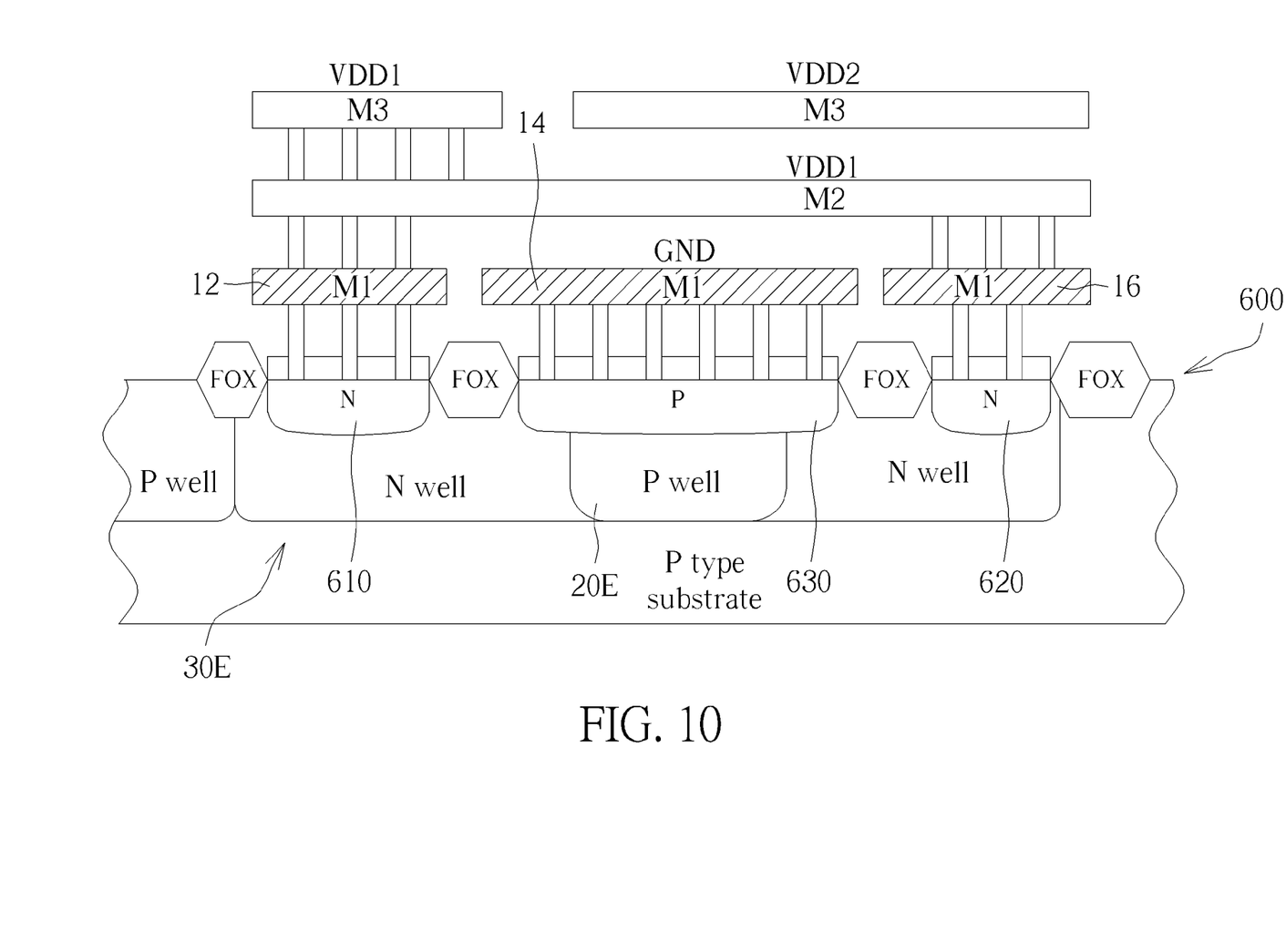
FIG. 10 is a diagram showing a cross-sectional view of the semiconductor structure for electrostatic discharge protection of the present invention corresponding to a cross section line A-A in FIG. 9.

Please refer to FIG. 9 and FIG. 10 together. FIG. 9 is a diagram showing a fourth embodiment of arrangement of the integrated circuit of the present invention. FIG. 10 is a diagram showing a cross-sectional view of the semiconductor structure for electrostatic discharge protection of the present invention corresponding to a cross section line A-A in FIG. 9. As shown in figures, an integrated circuit 10C of the present invention comprises a seal ring 12, a metal ring 14, and at least one power bus 16. The seal ring 12 is arranged at outer periphery of the integrated circuit 10C. The metal ring 14 is arranged at an inner side of the seal ring 12. The power bus 16 is arranged at an inner side of the metal ring 14. A semiconductor structure 600 comprises a first N type electrode area 610, a second N type electrode area 620, and a first P type electrode area 630. The first N type electrode area 610 is formed at a position on an N well 30E corresponding to the seal ring 12, and coupled to the seal ring 12. The second N type electrode area 620 is formed at a position on the N well 30E corresponding to the power bus 16, and coupled to the power bus 16. The first P type electrode area 630 is formed at a position partially on a P well 20E corresponding to the metal ring 14, and coupled to the metal ring 14. Wherein, the power bus 16 is coupled to a voltage source VDD1, the metal ring is coupled to a ground level GND, and the seal ring 12 is coupled to the power bus 16 via a metal layer M2 above, such that the seal ring 12 and the power bus 16 have a same voltage level.

According to the above arrangement, when the power bus 16 receives static electricity, PN junctions of the semiconductor structure 600 are broken down due to high level voltage of the static electricity, so as to discharge current of the static electricity to the metal ring 14 via the first P type electrode area 630, in order to provide electrostatic discharge protection. Moreover, partial energy of the static electricity is absorbed when the PN junctions are broken down.

In addition, in the embodiment of FIG. 10, the P well 20E is not necessarily required. That is, the first P type electrode area 630 can be formed on the N well 30E.

Figure 11:
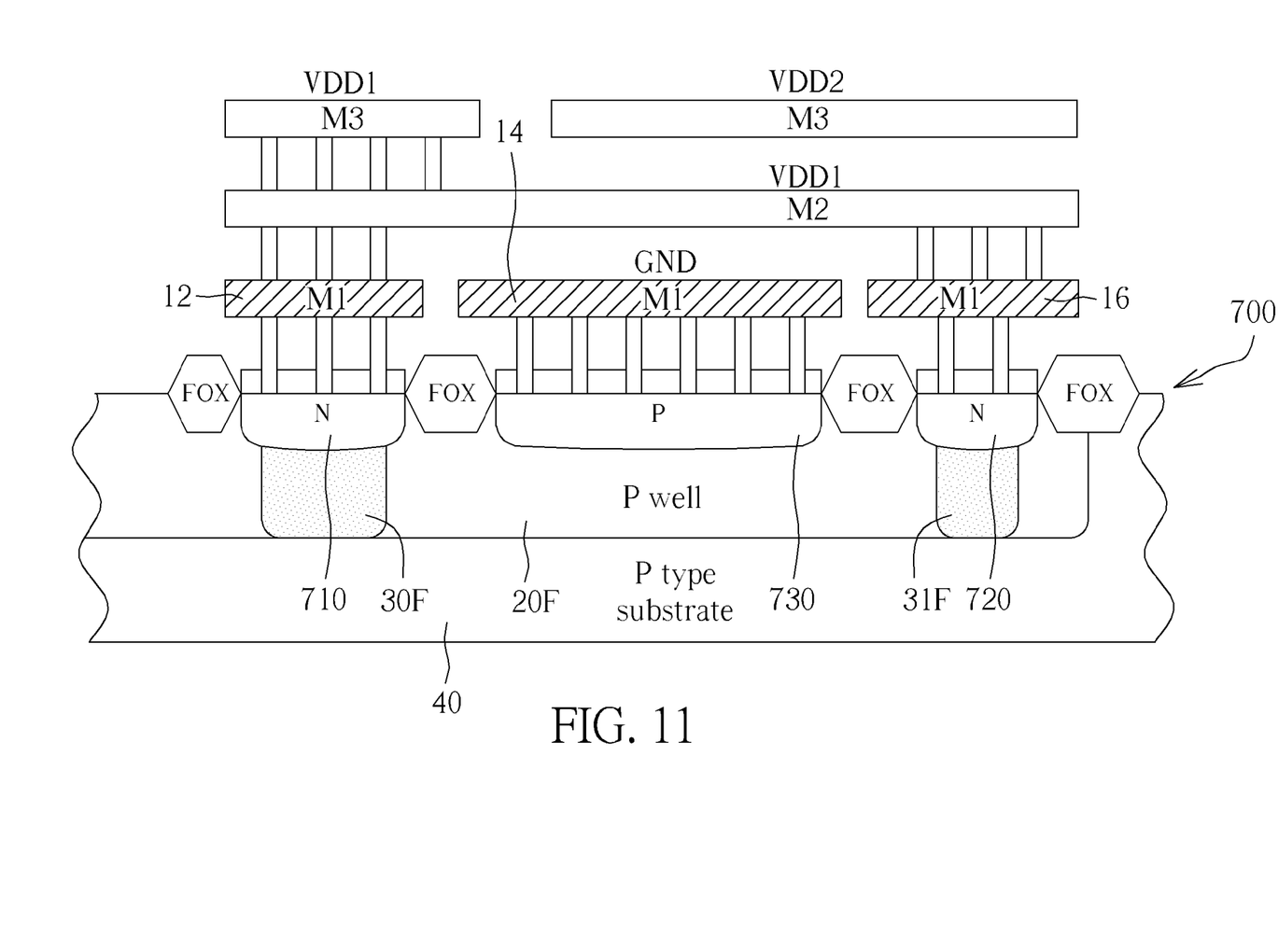
FIG. 11 is a diagram showing another cross-sectional view of the semiconductor structure for electrostatic discharge protection of the present invention corresponding to a cross section line A-A in FIG. 9.

Please refer to FIG. 9 and FIG. 11 together. FIG. 11 is a diagram showing another cross-sectional view of the semiconductor structure for electrostatic discharge protection of the present invention corresponding to a cross section line A-A in FIG. 9. As shown in FIG. 11, a semiconductor structure 700 comprises a first N type electrode area 710, a second N type electrode area 720, and a first P type electrode area 730. The first N type electrode area 710 is formed at a position on a P well 20F corresponding to the seal ring 12, and coupled to the seal ring 12. The second N type electrode area 720 is formed at a position on the P well 20F corresponding to the power bus 16, and coupled to the power bus 16. The first P type electrode area 730 is formed at a position on the P well 20F corresponding to the metal ring 14, and coupled to the metal ring 14. Wherein, the power bus 16 is coupled to a voltage source VDD1, the metal ring is coupled to a ground level GND, and the seal ring 12 is coupled to the power bus 16 via a metal layer M2 above, such that the seal ring 12 and the power bus 16 have a same voltage level.

The semiconductor structure 700 further comprises a first N well 30F and a second N well 31F. A center part of the first N type electrode area 710 is formed on the first N well 30F, and a peripheral part of the first N type electrode area 710 is formed on the P well 20F. A center part of the second N type electrode area 720 is formed on the second N well 31F, and a peripheral part of the second N type electrode area 720 is formed on the P well 20F.

According to the above arrangement, when the power bus 16 receives static electricity, PN junctions of the semiconductor structure 700 are broken down due to high level voltage of the static electricity, so as to discharge current of the static electricity from the first N type electrode area 710 and the second N type electrode area 720 to the metal ring 14 via the first P type electrode area 730, in order to provide electrostatic discharge protection. Moreover, partial energy of the static electricity is absorbed when the PN junctions are broken down.

Figure 12:
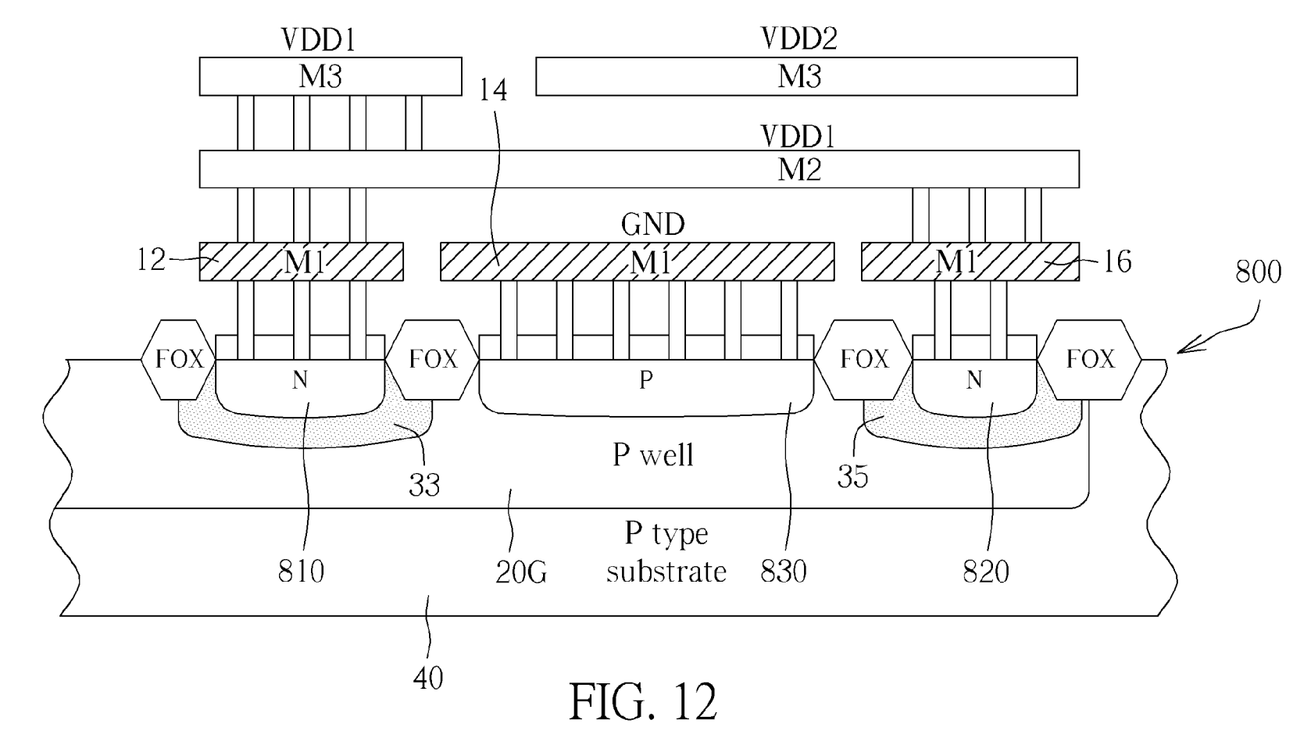
FIG. 12 is a diagram showing another cross-sectional view of the semiconductor structure for electrostatic discharge protection of the present invention corresponding to a cross section line A-A in FIG. 9.

Please refer to FIG. 9 and FIG. 12 together. FIG. 12 is a diagram showing another cross-sectional view of the semiconductor structure for electrostatic discharge protection of the present invention corresponding to a cross section line A-A in FIG. 9. As shown in FIG. 12, a semiconductor structure 800 comprises a first N type electrode area 810, a second N type electrode area 820, and a first P type electrode area 830. The first N type electrode area 810 is formed at a position on a P well 20G corresponding to the seal ring 12, and coupled to the seal ring 12. The second N type electrode area 820 is formed at a position on the P well 20G corresponding to the power bus 16, and coupled to the power bus 16. The first P type electrode area 830 is formed at a position on the P well 20G corresponding to the metal ring 14, and coupled to the metal ring 14. Wherein, the power bus 16 is coupled to a voltage source VDD1, the metal ring is coupled to a ground level GND, and the seal ring 12 is coupled to the power bus 16 via a metal layer M2 above, such that the seal ring 12 and the power bus 16 have a same voltage level.

Different from the embodiment of FIG. 11, the semiconductor structure 800 further comprises a first N type doping area 33 and a second N type doping area 35. The first N type doping area 33 is formed between the first N type electrode area 810 and the P well 20G, and doping concentration of the first N type doping area 33 is lower than doping concentration of the first N type electrode area 810. The second N type doping area 35 is formed between the second N type electrode area 820 and the P well 20G, and doping concentration of the second N type doping area 35 is lower than doping concentration of the second N type electrode area 820.

Similarly, according to the above arrangement, when the power bus 16 receives static electricity, PN junctions of the semiconductor structure 800 are broken down due to high level voltage of the static electricity, so as to discharge current of the static electricity from the first N type electrode area 810 and the second N type electrode area 820 to the metal ring 14 via the first P type electrode area 830, in order to provide electrostatic discharge protection. Moreover, partial energy of the static electricity is absorbed when the PN junctions are broken down.

In addition, in the embodiment of FIG. 12, since the first N type electrode area 810 and the second N type electrode area 820 are respectively covered by the first N type doping area 33 and the second N type doping area 35 without exposing to the P well 20G, compared to the semiconductor structure 700 of FIG. 11, the semiconductor structure 800 of FIG. 12 can withstand higher voltage.

In contrast to the prior art, the semiconductor structure for electrostatic discharge protection of the present invention is arranged at a position corresponding to the seal ring, the metal ring, and the power bus of the integrated circuit, without occupying additional space of the integrated circuit, so as to save space of the integrated circuit. Moreover, since the semiconductor structure for electrostatic discharge protection of the present invention is arranged at outer periphery of the integrated circuit, each element of the integrated circuit can be protected by the nearby semiconductor structure from electrostatic discharge, so as to further improve electrostatic protection capability of the integrated circuit.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor structure for electrostatic discharge protection, arranged on an integrated circuit, the integrated circuit comprising a seal ring arranged at outer periphery of the integrated circuit, a metal ring arranged at an inner side of the seal ring, and a power bus arranged at a side of the metal ring, the semiconductor structure comprising:
   a first P type electrode area formed at a position on a P well corresponding to the seal ring, and coupled to the seal ring;
   a second P type electrode area formed at a position on the P well corresponding to the metal ring, and coupled to the metal ring; and
   a first N type electrode area formed at a position corresponding to the power bus, and coupled to the power bus;
   wherein the seal ring and the metal ring are coupled to ground, and the power bus is coupled to a voltage source.

2. The semiconductor structure of claim 1, wherein the first P type electrode area, the second P type electrode area and the first N type electrode area are separated by a plurality of insulating areas.

3. The semiconductor structure of claim 1, wherein the plurality of insulating areas are field oxide (FOX) areas.

4. The semiconductor structure of claim 1, wherein the first N type electrode area is partially formed on the P well and an N well.

5. The semiconductor structure of claim 1, wherein the first N type electrode area is formed on the P well.

6. The semiconductor structure of claim 5, wherein the integrated circuit further comprises an N well coupled to the voltage source.

7. The semiconductor structure of claim 5, wherein the P well is formed on a P type substrate, the integrated circuit further comprises an N type buried layer arranged between the P well and the P type substrate.

8. The semiconductor structure of claim 1, wherein the power bus is arranged between the seal ring and the metal ring.

9. The semiconductor structure of claim 8, wherein the first N type electrode area is extended outward to form an N type doping area, and doping concentration of the N type doping area is lower than doping concentration of the first N type electrode area.

10. The semiconductor structure of claim 1 further comprising:
a second N type electrode area formed at a position on the P well corresponding to the seal ring, and coupled to the seal ring; and
a third N type electrode area formed at a position corresponding to the metal ring, and coupled to the metal ring.

11. The semiconductor structure of claim 10, wherein the second N type electrode area is closer to the first N type electrode area than the first P type electrode area, and the third N type electrode area is closer to the first N type electrode area than the second P type electrode area.

12. The semiconductor structure of claim 1, wherein the integrated circuit further comprises a plurality of coupling units for coupling the seal ring and the metal ring.

13. The semiconductor structure of claim 1, wherein the seal ring, the metal ring and the power bus are arranged at a same layer.

14. A semiconductor structure for electrostatic discharge protection, arranged on an integrated circuit, the integrated circuit comprising a seal ring arranged at outer periphery of the integrated circuit, a metal ring arranged at an inner side of the seal ring, and a power bus arranged at a side of the metal ring, the semiconductor structure comprising:
a first N type electrode area formed at a position on an N well corresponding to the seal ring, and coupled to the seal ring;
a second N type electrode area formed at a position on the N well corresponding to the power bus, and coupled to the power bus; and
a first P type electrode area formed at a position corresponding to the metal ring, and coupled to the metal ring;
wherein the seal ring and the power bus are coupled to a voltage source, and the metal ring is coupled to ground.

15. The semiconductor structure of claim 14, wherein the first N type electrode area, the second N type electrode area and the first P type electrode area are separated by a plurality of insulating areas.

16. The semiconductor structure of claim 15, wherein the plurality of insulating areas are field oxide (FOX) areas.

17. The semiconductor structure of claim 14 further comprising a P well, wherein the first P type electrode area is partially formed on the P well.

18. The semiconductor structure of claim 14, wherein the metal ring is arranged between the seal ring and the power bus.

19. The semiconductor structure of claim 18, wherein the integrated circuit further comprises a metal layer arranged above the seal ring, the metal ring and the power bus, for coupling the seal ring and the power bus.

20. A semiconductor structure for electrostatic discharge protection, arranged on an integrated circuit, the integrated circuit comprising a seal ring arranged at outer periphery of the integrated circuit, a metal ring arranged at an inner side of the seal ring, and a power bus arranged at a side of the metal ring, the semiconductor structure comprising:
a first N type electrode area formed at a position on an P well corresponding to the seal ring, and coupled to the seal ring;
a second N type electrode area formed at a position on the P well corresponding to the power bus, and coupled to the power bus; and
a first P type electrode area formed at a position on the P well corresponding to the metal ring, and coupled to the metal ring;
wherein the seal ring and the power bus are coupled to a voltage source, and the metal ring is coupled to ground.

21. The semiconductor structure of claim 20, wherein the first N type electrode area, the second N type electrode area and the first P type electrode area are separated by a plurality of insulating areas.

22. The semiconductor structure of claim 21, wherein the plurality of insulating areas are field oxide (FOX) areas.

23. The semiconductor structure of claim 20 further comprising:
a first N well, wherein a center part of the first N type electrode area is formed on the first N well, and a peripheral part of the first N type electrode area is formed on the P well; and
a second N well, wherein a center part of the second N type electrode area is formed on the second N well, and a peripheral part of the second N type electrode area is formed on the P well.

24. The semiconductor structure of claim 20 further comprising:
a first N type doping area, formed between the first N type electrode area and the P well, wherein doping concentration of the first N type doping area is lower than doping concentration of the first N type electrode area; and
a second N type doping area, formed between the second N type electrode area and the P well, wherein doping concentration of the second N type doping area is lower than doping concentration of the second N type electrode area.

25. The semiconductor structure of claim 20, wherein the metal ring is arranged between the seal ring and the power bus.

26. The semiconductor structure of claim 25, wherein the integrated circuit further comprises a metal layer arranged above the seal ring, the metal ring and the power bus, for coupling the seal ring and the power bus.

* * * * *